United States Patent
Goward

(10) Patent No.: US 11,469,199 B2
(45) Date of Patent: Oct. 11, 2022

(54) INTERCONNECT USING NANOPOROUS METAL LOCKING STRUCTURES

(71) Applicant: Meta Platforms Technologies, LLC, Menlo Park, CA (US)

(72) Inventor: John Michael Goward, Ayr (GB)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/100,807

(22) Filed: Nov. 20, 2020

(65) Prior Publication Data

US 2021/0098402 A1    Apr. 1, 2021

Related U.S. Application Data

(62) Division of application No. 16/128,265, filed on Sep. 11, 2018, now abandoned.

(Continued)

(51) Int. Cl.
*H01L 23/00* (2006.01)
*H01L 25/16* (2006.01)
(Continued)

(52) U.S. Cl.
CPC ............. *H01L 24/11* (2013.01); *H01L 24/13* (2013.01); *H01L 24/16* (2013.01); *H01L 24/81* (2013.01);
(Continued)

(58) Field of Classification Search
CPC ... H01L 24/11; H01L 25/0753; H01L 25/167; H01L 24/81; H01L 24/16; H01L 24/13; H01L 33/62; H01L 33/0095; H01L 2224/81345; H01L 2224/81203; H01L 2224/1607; H01L 2224/16147; H01L 2224/16148; H01L 2224/13144; H01L 2224/13018; H01L 2224/13011; H01L 2224/11831; H01L 2224/11462; H01L 2933/0066; H01L 2224/81385; H01L 2224/0401; H01L 24/05; H01L 2224/0362; H01L 2224/05558; H01L 2224/05571; H01L 2224/1147; H01L 2224/115; H01L 2224/11502; H01L 2224/11848; H01L 2224/13005; H01L 2224/13017; H01L 2224/13023; H01L 2224/16112; H01L 2224/73204; H01L 2224/81141; H01L 2224/81191; H01L 2224/81192;

(Continued)

(56) References Cited

U.S. PATENT DOCUMENTS

2012/0049350 A1    3/2012  Grillberger et al.
2014/0356986 A1*  12/2014  Clore .................... G06F 30/398
                                                     716/112

(Continued)

*Primary Examiner* — Cuong B Nguyen
(74) *Attorney, Agent, or Firm* — Fenwick & West LLP

(57) ABSTRACT

Embodiments relate to the design of a device capable of maintaining the alignment an interconnect by resisting lateral forces acting on surfaces of the interconnect. The device comprises a first body comprising a first surface with a nanoporous metal structure protruding from the first surface. The device further comprises a second body comprising a second surface with a locking structure to resist a lateral force between the first body and the second body during or after assembly of the first body and the second body.

20 Claims, 7 Drawing Sheets

Related U.S. Application Data

(60) Provisional application No. 62/622,680, filed on Jan. 26, 2018.

(51) Int. Cl.
  H01L 33/62 (2010.01)
  H01L 25/075 (2006.01)
  H01L 33/00 (2010.01)

(52) U.S. Cl.
  CPC ........ H01L 25/0753 (2013.01); H01L 25/167 (2013.01); H01L 33/62 (2013.01); H01L 33/0095 (2013.01); H01L 2224/11462 (2013.01); H01L 2224/11831 (2013.01); H01L 2224/13011 (2013.01); H01L 2224/13018 (2013.01); H01L 2224/13144 (2013.01); H01L 2224/1607 (2013.01); H01L 2224/16147 (2013.01); H01L 2224/16148 (2013.01); H01L 2224/81203 (2013.01); H01L 2224/81345 (2013.01); H01L 2224/81385 (2013.01); H01L 2933/0066 (2013.01)

(58) Field of Classification Search
  CPC . H01L 2224/81193; H01L 2224/81201; H01L 2224/8184; H01L 2224/81897; H01L 2224/81903; H01L 2224/92125; H01L 23/528
  See application file for complete search history.

(56) References Cited

U.S. PATENT DOCUMENTS

| | | |
|---|---|---|
| 2015/0235984 A1 | 8/2015 | Aoyagi et al. |
| 2017/0164853 A1 | 6/2017 | Kim et al. |
| 2019/0157532 A1 | 5/2019 | Meitl et al. |

* cited by examiner

INTERCONNECT USING NANOPOROUS METAL LOCKING STRUCTURES

CROSS REFERENCE TO RELATED APPLICATIONS

This application is a division of co-pending U.S. application Ser. No. 16/128,265, filed Sep. 11, 2018, which claims benefit of U.S. Provisional Application No. 62/622,680, filed Jan. 26, 2018, which is incorporated by reference in its entirety.

BACKGROUND

The present disclosure relates to maintaining the alignment of electronic components in an interconnect, and in particular to, using nanoporous metal structures to maintain the alignment of the electronic components of the interconnect.

Conventional techniques for the assembly of devices using electronic components risk misalignment of the electronic components during or after assembly of the device due to lateral forces acting on the components being adjoined. The misalignment is especially a concern as the size of such a device decreases, for example below 3 µm or a sub-micron size. Devices with sizes within such ranges are often assembled with equipment lacking an alignment accuracy tolerance or equipment relying on inaccurate optical alignment techniques.

SUMMARY

Embodiments relate to an interconnect that includes one or more nanoporous metal structures for maintaining the alignment between a first body and a second body. The first body has a first surface with at least one nanoporous metal structure protruding from the first surface. The second body has a second surface with corresponding locking structures penetrating through the surface and engaging the nanoporous metal structures to maintain the alignment of the interconnect.

In one or more embodiments, as pressure is applied to the first and second surfaces, the nanoporous metal collapses vertically into the locking structures of the second body. When locked and adjoined with the locking structures of the second body, the nanoporous metal structures resist lateral forces acting orthogonal to the surfaces of both the first and second body. By resisting the lateral forces, the interconnect reduces the risk of assembly misalignment due to the lateral forces and maintains the alignment between the two bodies.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

Embodiments relate to an interconnect including nanoporous metal structures extending from a body and locking structures on another body where the nanoporous metal structures insert into and at least partly collapse within the locking structures to resist lateral forces applied between the first body and the second body during or after assembly of the first body and the second body. The interconnect formed in this matter improves the bonding between the two bodies and maintains the alignment during and after assembly.

Conductive Bodies of the Interconnect

Figure 1A:
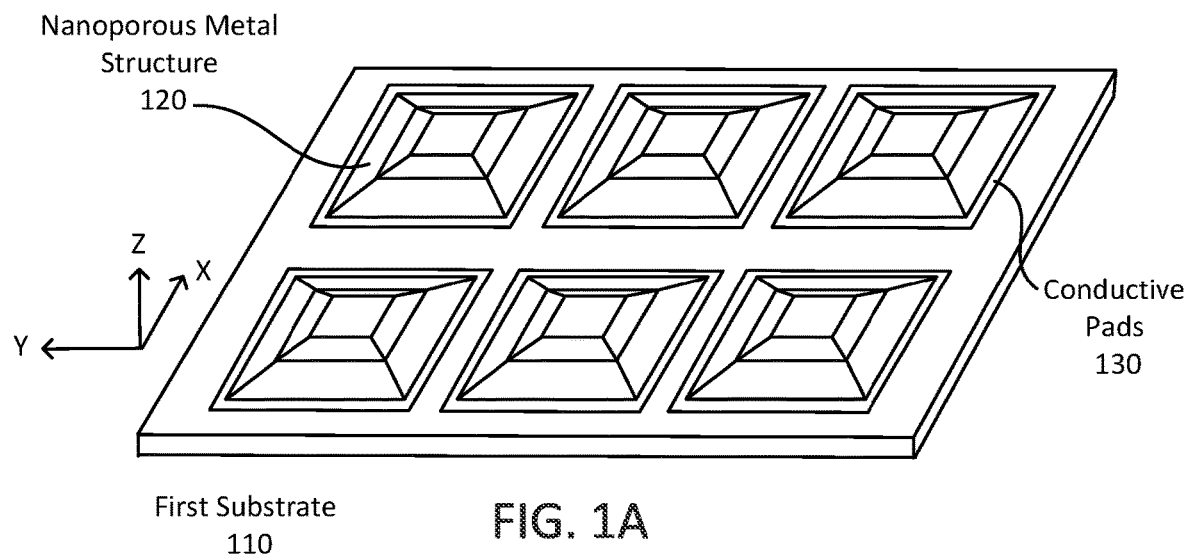
FIG. 1A is a perspective view illustrating an array of nanoporous metal structures formed on a first substrate, according to an embodiment.

FIG. 1A is a perspective view illustrating an array of nanoporous metal structures 120 on a micro light emitting diode (µLED) substrate 110 (hereinafter also referred to as the "first substrate 110"), according to an embodiment. As illustrated in FIG. 1A, the first body (i.e. first substrate 110) has multiple conductive pads 130, each aligned with other conductive pads 130 of the first substrate 110 in the X and Y direction (as illustrated in FIG. 1A). In one embodiment, the conductive pads 130 are placed in a regular pattern. In other embodiments, the conductive pads 130 are placed in an irregular pattern. The conductive pads 130 may all be of the same size and shape. Alternatively, the conductive pads 130 may be of different sizes and shapes.

Mounted to each conductive pad 130 is a nanoporous metal structure 120 protruding upwards along the Z axis from the surface of the conductive pads 130. The first substrate 110 includes at least one nanoporous metal structure 120 depending on the size of the first substrate 110. In the illustrated embodiment of FIG. 1A, each nanoporous metal structure 120 has a stepped conic shape such that the area of the face at each step decreases as the nanoporous metal structure 120 extends away from the first substrate 110 along the Z axis. In other embodiments, the nanoporous metal structures 120 have a conical shape, as discussed below in detail with reference to FIG. 3. In additional embodiments Nanoporous metal structures 120 may be formed by dealloying binary alloys, for example Au-based alloys (e.g., Au—Ag alloy), or tertiary alloys (e.g., Au—Ag—Pt) that have been formed by the deposition of different monometallic species simultaneously in a range of percent compositions. The less noble elements in the alloy are deposited at a higher percent composition than the metallic species remaining after the dealloying process, forming the nanoporous material in-situ. For example, after undergoing the dealloying process, typical compositions of the Ag—Au alloy result in nanoporous gold in the range of 0% composition to 45% composition Au, with the remaining percentage being Ag. However, alloys with increased composition ratios of Au may not result in the formation of nanoporous materials post dealloying. In some implementations, other nanoporous metal compositions are implemented, for example nanoporous copper using a plated composition of copper and zinc.

In embodiments using electroplating to initiate the dealloying process for the nanoporous metal structures 120, the percentage of Ag salts to Au salts in the plating solution determines the percentage composition of the deposited feature. The higher the concentration of Ag in the plating bath, the higher the percentage composition of Ag in the final feature. Pulse plating, in which DC power is provided in a series of short pulses, may also be implemented to form finer nanoporous metal structures during the end of the process. Additionally, DC plating may also be implemented. The electropotential required to plate Ag over Au is lower, therefore Ag will preferentially plate before Au. In most embodiments, 20 to 30% of the initial co-alloy composition is Au. Upon dealloying, the nanoporous metal structures 120 do not change significantly in the X, Y, and Z dimensions if the composition ration stays constant.

During the dealloying process, Ag is removed from the alloy in a strong corrosive environment (e.g., an acid etch or reverse electro-chemical processing), to produce an open pore network structure that consists mostly of Au by removing the Ag content from the metallic species. Due to the adatomic movement of the remaining gold species during the dealloying process, the Au will form a network of fine ligaments with an open pore structure. The size of the pore structure may depend upon the de-alloying processing technique. In embodiments in which a nitric acid etch is used to dealloy the Ag—Au species, a coarse nanoporous metal structure 120 may form at temperatures above room temperatures a concentrations of acid above 30%. In alternate embodiments in which the temperature is below room temperatures (e.g., 0° C. and 18° C.) or the concentration of acid is below 30%, a finer nanoporous material forms.

By varying the composition ratio of the nanoporous metal structure 120 during the electroplating step, a higher or lower percentage of the lower noble metal (i.e., Ag) results in a gradient of composition in the final nanoporous metal structure 120. As the dealloying process forms a gradient of composition, the dimensions of the nanoporous metal structures 120 change in the X and Y dimensions, without a significant reduction in the Z dimension, resulting in a the conic shape of the nanoporous metal structures 120.

As illustrated in FIG. 1A, the X and Y dimensions refer to the dimensions of nanoporous metal structure 120 in the same plane as the surface of the first substrate 110 (e.g., the length and width of the nanoporous metal structure 120) and the Z dimension refers to the dimension perpendicular to the plane of the surface of the first substrate 110 (e.g., the height of the nanoporous metal structure 120). By varying the percentage composition of the lower noble material (i.e., Au in an Ag—Au alloy), a stepped conic shape of the of nanoporous metal structures 120 may be formed. In the stepped conic shape, each step represents a separate plate of the nanoporous metal with a different gradient of composition where the dimensions of each plate are determined based on the percentage composition of the alloy. As the plating potential is stepped down in response to decreases in the voltage, a higher composition concentration of Ag plates to the first conductive surface. Accordingly, in some implementations, a preferential plating technique may be implemented in conjunction with step plating voltage conditions to form successive thin layers of nanoporous metal structures containing lower concentrations of plated Au. In such implementations, when the Ag is de-alloyed to form the nanoporous metal structure, the nanoporous metal structure may resemble a step-function extruding from the first substrate 110.

In alternative embodiments, the shapes of the nanoporous metal structures 120 are determined using a former, for example a pre-patterned photomask on top of a plating seed layer that is resistant to chemical change of the photomask material and the removal of the seed layer between adjacent features. To remove the photomask, a suitable solvent, for example, acetone, may be applied to the surface of the photomask. The seed layer may be subsequently removed using a dry etch process, for example, ion bean etching, reactive ion beam etching, or another similar technique. Given the small surface area of the nanoporous metal structure 120, formation of the nanoporous metal structures does not require an etch mask layer. Therefore, the surface of the photomask may be etched at the same rate as the seed layer, resulting in the composition layer of the nanoporous metal structure 120 including only Ag at a thickness equivalent to that of the seed layer.

After the removal of the photomask material and seed layers, the dealloying process may be carried out to form the nanoporous metal.

Morphology of the nanoporous metal structures 120 may be further modified by thermal treatment. For example, the nanoporous gold structure may be heated to increase the surface diffusion of gold atoms and resultantly increase average pore size. In addition or alternatively to nanoporous gold, the structures 160 may include one or more different type of nanoporous metal, for example, nanoporous copper, another single, binary, or tertiary metallic species, or some combination thereof.

Figure 1B:
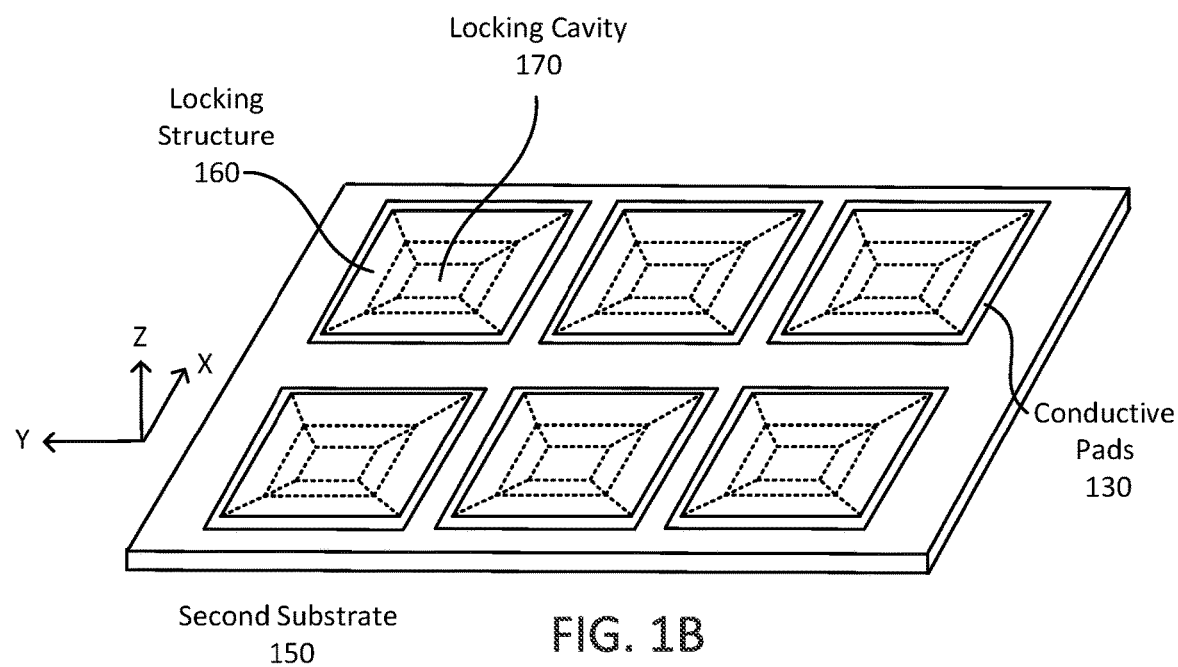
FIG. 1B is a perspective view illustrating an array of locking structures positioned on a second substrate, according to an embodiment.

FIG. 1B is a perspective view illustrating an array of locking structures 160 positioned on a second substrate 150 (e.g., a CMOS backplane), according to an embodiment. The locking structures 160 may be integrated into a different types of substrate formed with circuits to operate a light emitting diode to which the nanoporous metal structures 120 are mounted. As illustrated in FIG. 1B, the second substrate 150 has multiple locking structures 160, each aligned with other locking structures 160 of the second substrate 150 in the X and Y direction. The number of locking structures 160 formed into the surface of the second substrate 150 corresponds to the number of nanoporous metal structures 120 formed on the first substrate 110, for example a 1:1 ratio, such that each nanoporous metal structure 120 inserts into a single locking structure 160. In alternative implementations, the second surface is planar.

Each locking structure 160 includes an indented portion penetrating beneath the surface of the second substrate 150, referred to as a locking cavity 170, which receives the tip of the nanoporous metal structure 120. During the assembly of the interconnect, pressure is applied to either or both of the surface of the first body (i.e., the substrate) opposite the nanoporous metal structures 120 and the surface of the second substrate 150 opposite the locking structures 160 to collapse each nanoporous metal structure 120 into a locking structure 160. During assembly, the entire nanoporous metal structure 120 or at least a portion of the structure 120 (e.g., the tip of the stepped conic structure or the tip of the conic structure) collapses and fills the locking cavity 170. Accordingly, each locking cavity 170 is complementary to the corresponding nanoporous metal structure 120. As described in reference to FIG. 1A, the nanoporous metal structures 120 have a stepped conic shape, such that the plates decrease in surface area as they protrude away from the first substrate 110. Accordingly, the locking cavity 170 of a locking structure 160 has a complementary stepped conic configuration. As a nanoporous metal structure 120 protrudes away from the first surface of the first body, a locking structure 160 penetrates into the second surface of the second substrate 150, allowing each nanoporous metal structure 120 to be inserted into the surface of the second substrate 150 rather than merely resting atop of the second substrate 150.

The dashed lines of the locking structures 160 of FIG. 1B represent plates of the stepped configuration penetrating through a surface compared to the solid lines of the nanoporous metal structures 120 of FIG. 1A which represent plates of the stepped shaped protruding away from a surface. Additionally, in order to receive a nanoporous material structure, the X and Y dimensions at the base of a locking cavity 170 mirror the X and Y dimensions of the tip of the corresponding nanoporous metal structure 120 and the X and Y dimensions at the top of a locking cavity 170 mirror the X and Y dimensions of the base of the corresponding nanoporous metal structure 120.

In one embodiment, the locking structures 160 are formed through microfabrication, for example a photolithographic process. In such an embodiment, the substrate on which the locking structures 160 are formed (i.e., second substrate 150) is heated to remove moisture and from the surface and coated with photoresist to design the areas where the locking structures 160 are to be developed. After being exposed to light, the photoresist is removing using acid etching techniques to expose the fully formed locking structures 160 on the surface of the substrate. In some implementations, the locking structures 160 are formed deeper within the surface of the second substrate 150 using a series of successively smaller photolithographically defined openings. To ensure an electrical connection is enabled between the locking structure 160 and the conductive pads 130 of the second substrate 150, the second substrate 150 may also be plated with metal.

Engaging Nanoporous Gold Structures with Locking Structures

Figure 2A:
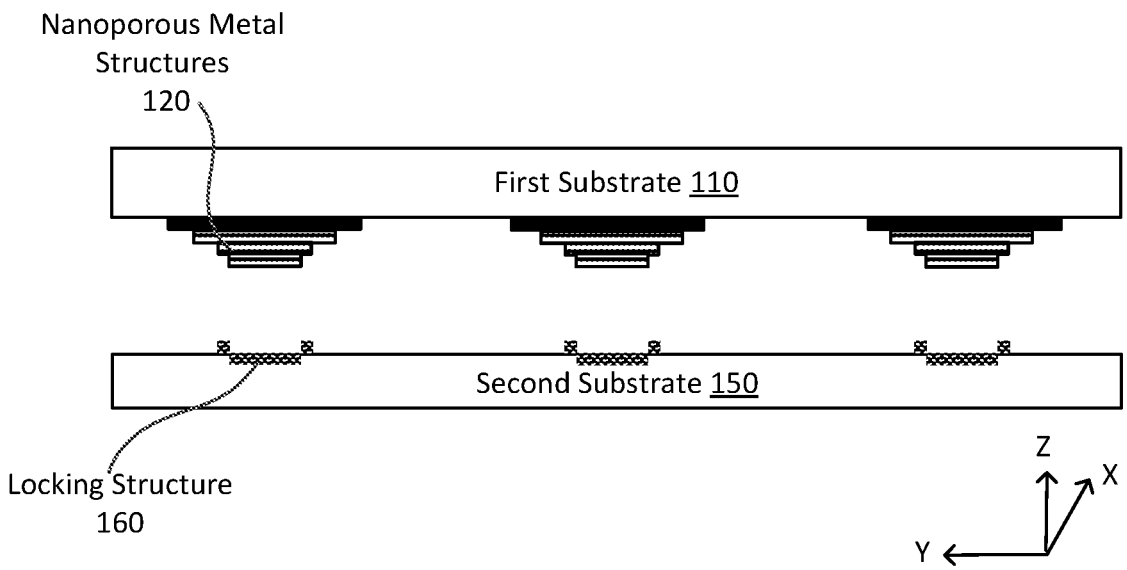
FIGS. 2A-2C are cross-sectional views illustrating a process of engaging stepped conic nanoporous metal structures with locking structures, according to an embodiment.
Figure 2B:
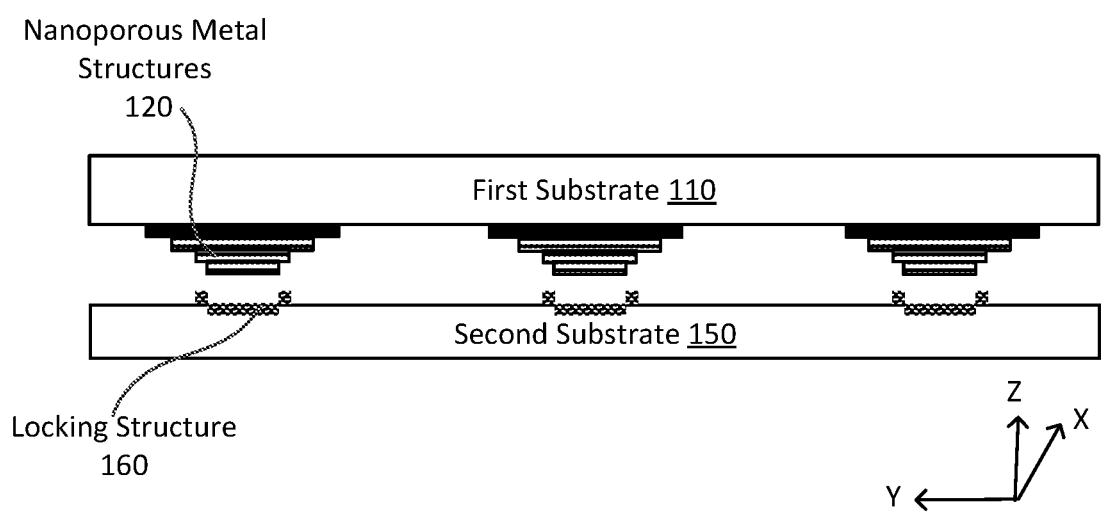
Figure 2C:
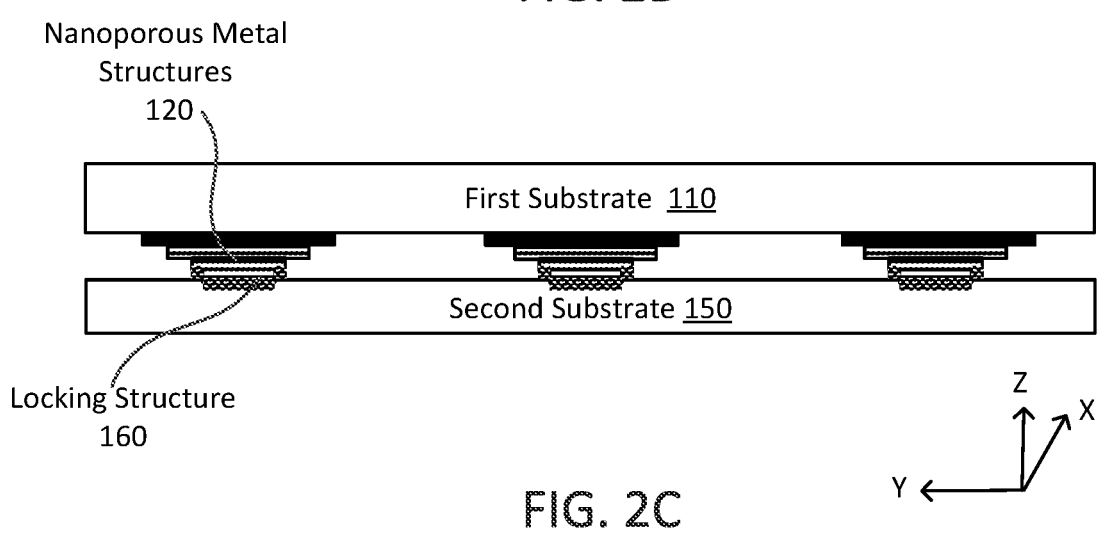

After a nanoporous metal structure 120 engages and mechanically interlocks with the corresponding locking structure 160, the two bodies can resist lateral forces due to orthogonal pressures acting on either body during or after the assembly of the interconnect. FIGS. 2A-2C are cross-sectional views illustrating a process for engaging stepped conic nanoporous metal structures 120 with locking structures 160, according to an embodiment. FIG. 2A illustrates the initial positioning of the first substrate 110 and the second substrate 150 prior to being adjoined, according to an embodiment. The nanoporous metal structures 120 and the corresponding locking structures 160 are not in contact or adjoined, but are aligned such that if either surface were moved towards the other along a linear path in the Z direction, each nanoporous metal structure 120 would engage with the corresponding locking structure 160. The movement of either the first substrate 110 or the second substrate 150 to align the nanoporous metal structures 120 and the locking structures 160 may be made, for example, by a mount 510, as described below in detail with reference to FIG. 5.

FIG. 2B illustrates an updated position of the first substrate 110 relative to the second substrate 150 where the nanoporous metal structures 120 are moved closer to the locking structures 160, according to one embodiment. Given the physical properties of nanoporous metal structures, a low pressure must be applied to the surface of the first substrate 110, the second substrate 150, or both for the tip of a nanoporous metallic structure to make first electrical contact and lock into a locking structure 160. Moreover, because of the reduced surface area at the tip of both the stepped conic shaped or conic shaped nanoporous metal structures 120, the pressure required to adjoin the two bodies is further reduced. In embodiments in which sufficient pressure is applied, the nanoporous metal structures 120 take on the properties of the bulk metal (e.g., bulk gold).

FIG. 2C illustrates a position at which the tips of the nanoporous metal structures 120 make first contact with the locking structures 160, according to an embodiment. At such a position, the nanoporous metal structures 120 begin to individually engage and insert into locking structures 160, and in the process, the nanoporous metal structures 120 also begin to lock into place. During such engagement, part of the nanoporous metal structures 120 may collapse to fill any remaining space in the corresponding locking structure 160. After the first substrate 110 and second substrate 150 are adjoined to complete the interconnect, the tips of each nanoporous metal structure 120 are in contact with the base of the corresponding locking structure 160. After each nanoporous metal structure 120 locks into the corresponding locking structure 160, the completed interconnect is resistant to lateral forces applied to the either surface of the bodies. The amount of lateral force that the assembly can withstand depends on the number of interconnects and the strength of the nanoporous metal structures 120. Accordingly, the two bodies (i.e., the first substrate 110 and the second substrate 150) resist misalignment due to external forces on either surface during or after assembly of the interconnect.

Additionally, when the tips of nanoporous metal structures 120 make contact with the base of the locking structure 160, the completed interconnect creates an electrical connection between the two bodies (i.e., the first substrate 110 and the second substrate 150).

As shown in FIG. 2C after adjoining the two bodies, an underfill material may be applied to increase the adhesion between the 2 planar surfaces (i.e., the surface of the first substrate 110 on which the nanoporous metal structures 120 are grown and the surface of the second substrate 150 on which the locking structures 160 are formed). The underfill material may also be applied in a thin layer on either surface prior to the surfaces being aligned and adjoined.

Figure 3A:
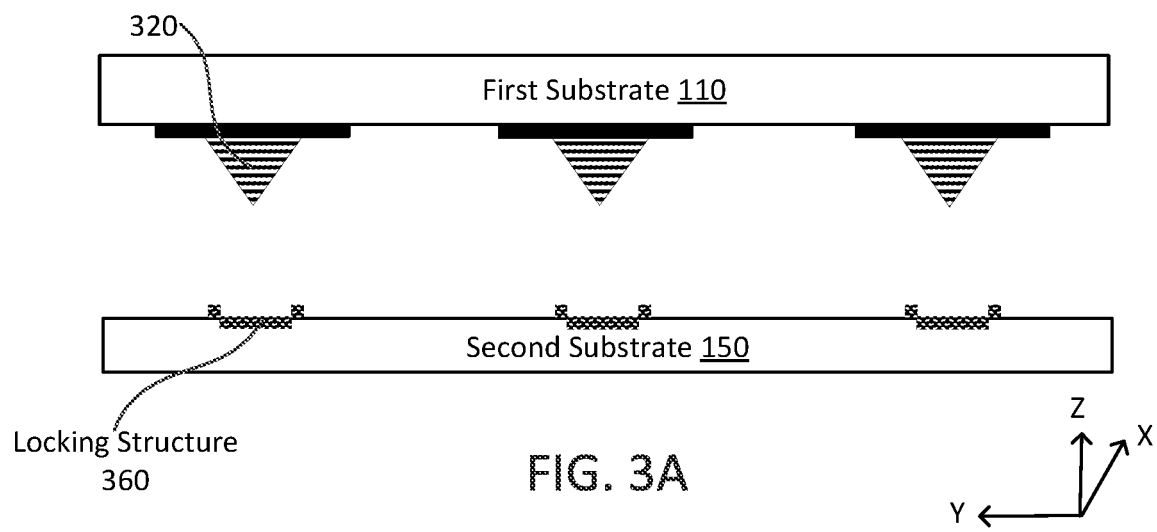
FIGS. 3A-3C are cross-sectional views illustrating a process of engaging conic nanoporous metal structures with locking structures, according to an embodiment.
Figure 3B:
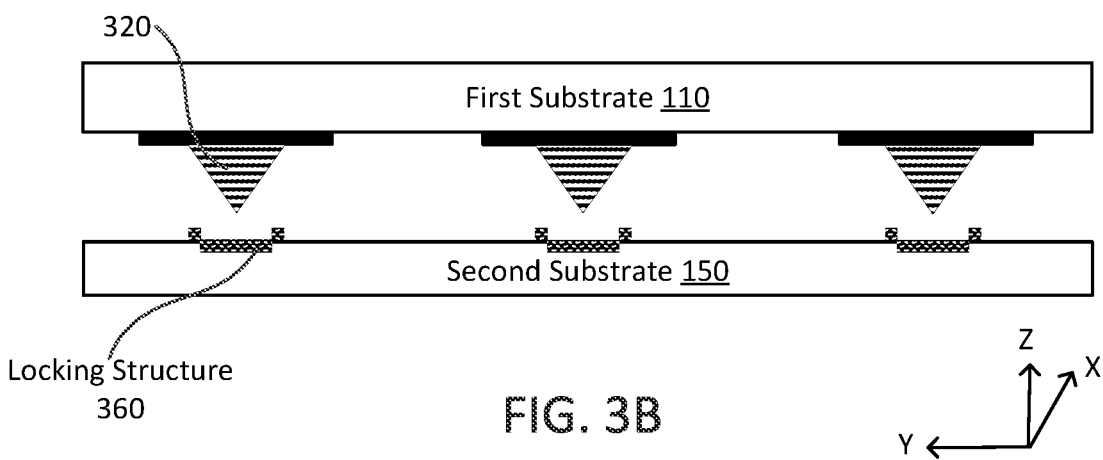
Figure 3C:
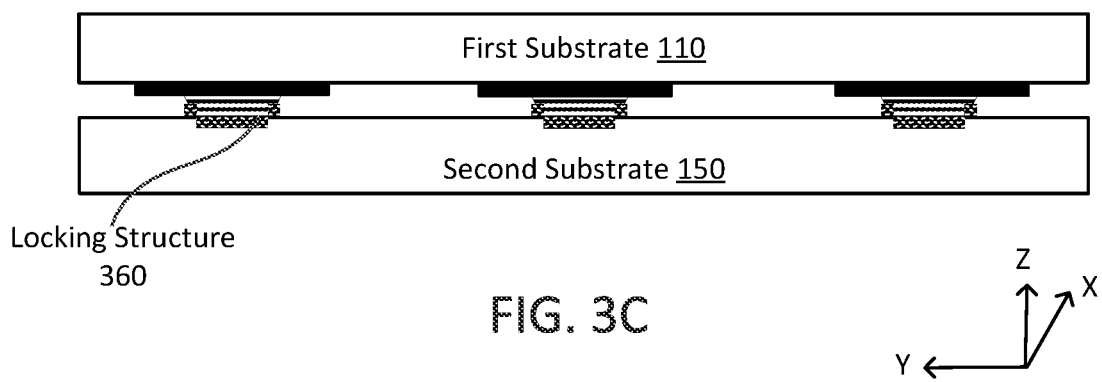

FIGS. 3A-3C are cross-sectional views illustrating a process for engaging conic nanoporous metal structures 320 with locking structures 360, according to an embodiment. The description above in regards to the stepped conic nanoporous metal structures of FIGS. 2A-2C also applies to the conic nanoporous metal structures of FIGS. 3A-3C. In such an embodiment, the locking structures 360 are complementary to the conic nanoporous metal structures 320. Accordingly, the base of each locking structure 360 mirrors the dimensions of the leading point of the conic nanoporous metal structures 320 and the tops of each locking structures 360 mirrors the dimensions of the base of the conic nanoporous metal structures 320. FIG. 3A illustrates the initial positioning of the first substrate 110 and the second substrate 150 prior to being adjoined, according to an embodiment. FIG. 3B illustrates an updated position of the first substrate 110 relative to the second substrate 150 where the nanoporous metal structures 320 are moved closer to the locking structures 360, according to one embodiment. FIG. 3C illustrates a position at which the tips of the nanoporous metal structures 320 make first contact with the locking structures 360, according to an embodiment. Similarly, once each conic nanoporous metal structure 320 locks into a locking structure 360, the alignment accuracy of the first substrate 110 and the second substrate 150 is independent of lateral forces acting on the surfaces of either body.

Figure 4A:
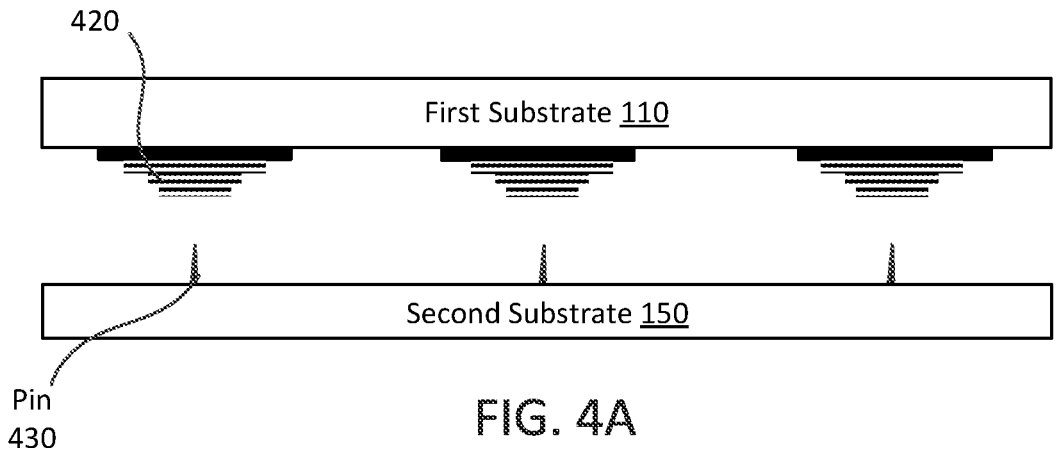
FIG. 4A-4C are cross-sectional views illustrating a process for engaging stepped conic nanoporous metal structures with pins, according to an embodiment.
Figure 4B:
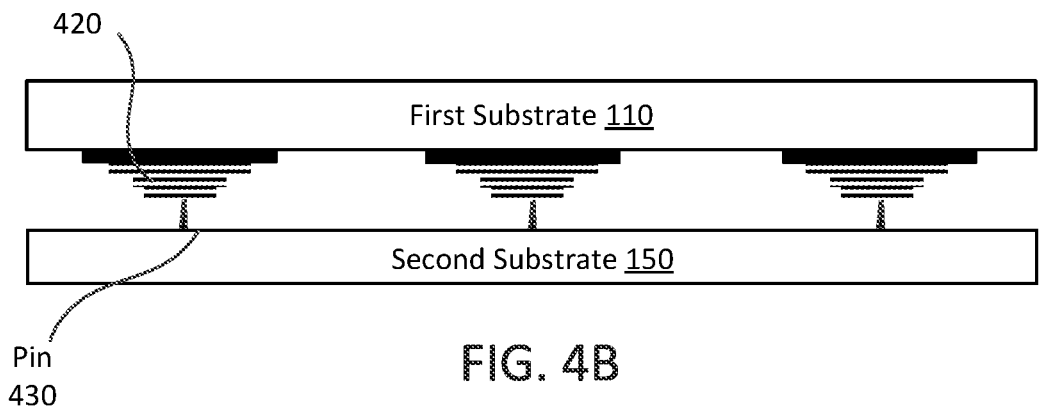
Figure 4C:
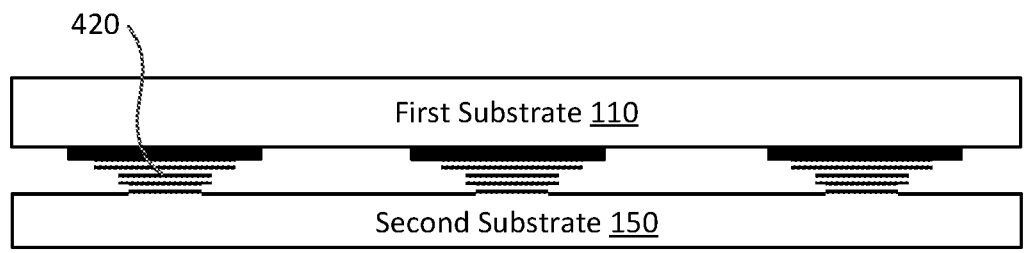

FIGS. 4A-4C are cross-sectional views illustrating a process for engaging stepped conic nanoporous metal structures 420 with pins 430, according to an embodiment. The description above in regards to engaging the stepped conic nanoporous metal structures of FIGS. 2A-2C also applies to stepped conic nanoporous metallic structures 420 engaging with a pin 430. In some embodiments, the pin 430 is placed or formed on the second substrate 150 instead of the locking structure 160. In other embodiments, the pin 430 may be placed in addition to the locking structure 160. The pin 430 may be metallic, for example a carbon nanofiber or a carbon nanotube, or a small solid-metallic surface composed of the same metallic species as the nanoporous metal structure 120. Geometrically, the pin 430 may have a diameter smaller than the largest circumference or perimeter of the nanoporous metal structure 420 in order to penetrate the nanoporous metal structure 420. FIG. 4A illustrates the initial positioning of first substrate 110 and second substrate 150 prior to being adjoined, according to an embodiment. FIG. 4B illustrates an updated position of the first substrate 110 relative to the second substrate 150 where nanoporous metal structures 420 are moved closer to the pin 430, according to an embodiment. At the illustrated position, the nanoporous gold structures 420 make initial contact with the pin 430 such that each metallic pin 430 penetrates a nanoporous metal structure 420. The pins 430 are structurally rigid compared to the nanoporous metals that form the nanoporous conductive structures mounted to the first body. FIG. 4C illustrates a position at which each of the pins 430 completely penetrate the nanoporous metal structures 420, according to an embodiment. Similar to the locking structures 160, the pins 430 hold the nanoporous gold structures 420 in a fixed position to maintain the alignment and alignment accuracy against lateral forces acting on the surfaces of either the first substrate 110 or the second substrate 150.

Mechanism for Engaging Nanoporous Metal Structures with Locking Structures

Figure 5:
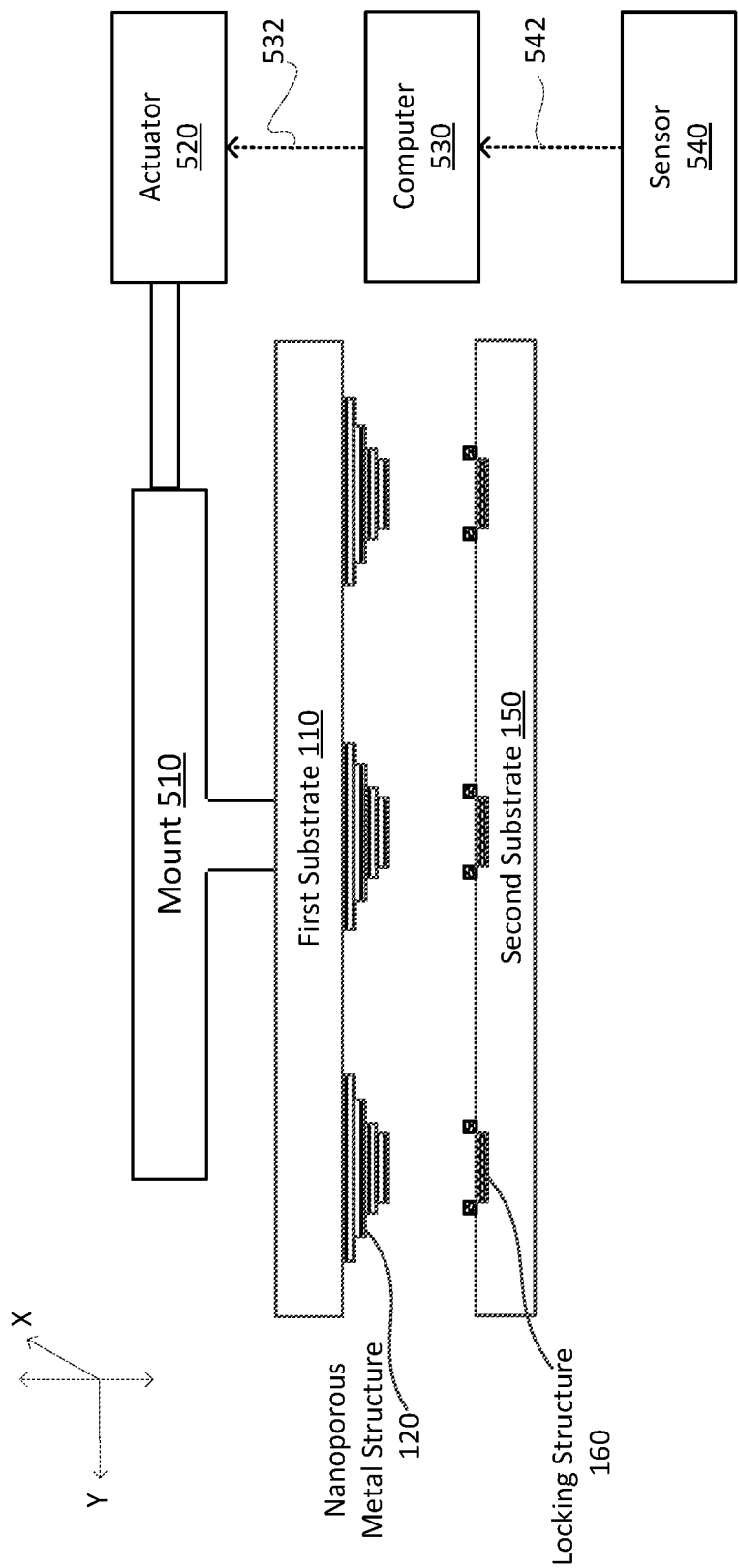
FIG. 5 is a block diagram illustrating components for engaging stepped conic nanoporous metal structures with locking structures, according to an embodiment.

FIG. 5 is a block diagram illustrating components for engaging nanoporous metal structures 120 on a substrate with locking structures 160 on a second substrate 150, according to an embodiment. The components include, among others, a mount 510, an actuator 520 operating the mount 510, a computer 530 and a sensor 540. The mount 510 is attached to the first substrate 110 and places the first substrate 110 onto the second substrate 150 by aligning the nanoporous metal structures 120 of the first substrate 110 with the locking structures 160 of the second substrate 150. If a voltage difference is applied between the nanoporous metal structures 120 and if the first substrate 110 is properly placed, the substrate first 110 conducts current through nanoporous metal structures 120 to the second substrate 150.

The sensor 540 detects the alignment of the second substrate 150 and the first substrate 110 and may also detect the distance between the surface of the first substrate 110 with the conductive pads 130 and the surface of the second substrate 150 with the locking structures 160. The sensor 540 generates image signals that function as real time feedback to update the position of the first substrate 110 during the coupling process. The sensor 540 sends measurement signals 542 to the computer 530. Although only a single sensor 540 is illustrated in FIG. 3, multiple sensors can be used to detect the alignment and the distance between the first substrate 110 and the second substrate 150.

The sensor 540 may be an image capturing device that captures the images of the first substrate 110 to determine whether the tips of each nanoporous metal structure 120 have made contact with the locking structures 160 of the second substrate 150. In alternative embodiments, the sensor 540 may detect a distance between interior facing surface of the first substrate 110 and the interior facing surface of the second substrate 150. As the actuator moves the first substrate 110 closer to the second substrate 150, the sensor 540 periodically updates the spatial measurement until the measurement is within a threshold distance. After detecting a threshold distance, the sensor 540 may cause the actuator 520 to stop the movement of the mount 510.

Using the measurement signals 542, the computer 530 sends control signals 532 to the actuator 520. The actuator 520 is attached to the mount 510 and provides instructions for the mount 510 to apply pressure to exterior facing surface of the first substrate 110 such that the nanoporous metal structures 120 move closer to the locking structures 160.

The mount 510 moves the first substrate 110 according to the movement of the actuator 520 to place the first substrate 110 onto the second substrate 150. The mount 510 can support any number of first substrates 110 and can place multiple substrates onto the second substrate 150 at once. In some embodiments, the sensor 540 is placed on top of the mount 510 that is transparent to allow the sensor 540 to capture alignment of the nanoporous metal structures 120 and the locking structures 160.

The actuator 520 is coupled to the mount 510 and controls movement of the mount 510. By moving the mount 510, the actuator 520 aligns the mount 510 and the first substrate 110 with the second substrate 150 by aligning the nanoporous metal structures 120 with the locking structures 160. In some embodiments, the actuator 520 is a multiple degree of freedom actuator, such as an actuator that is configured to move the mount 510 up and down, left and right, forward and back. The actuator 520 may also adjust yaw, tilt, or rotate the mount 510. In some embodiments, multiple actuators 520 couple to multiple mounts 510 to perform first substrate 110 position tasks in parallel to increased throughput.

The computer 530 controls the overall operation of joining the first substrate 110 and the second substrate 150. For this purpose, the computer 530 provides control signals 532 to the actuator 520 and receives the measurement signals 542 received from the sensor 540. The computer 530 is further described with reference to FIGS. 6-7.

In some embodiments, the apparatus comprises a heat plate (not shown in FIG. 5) capable of controlling the temperature of the second substrate 150 by heating or cooling the first substrate 110. This may be advantageous for bonding the nanoporous metal structures 120 to the locking structures 160.

Figure 6:
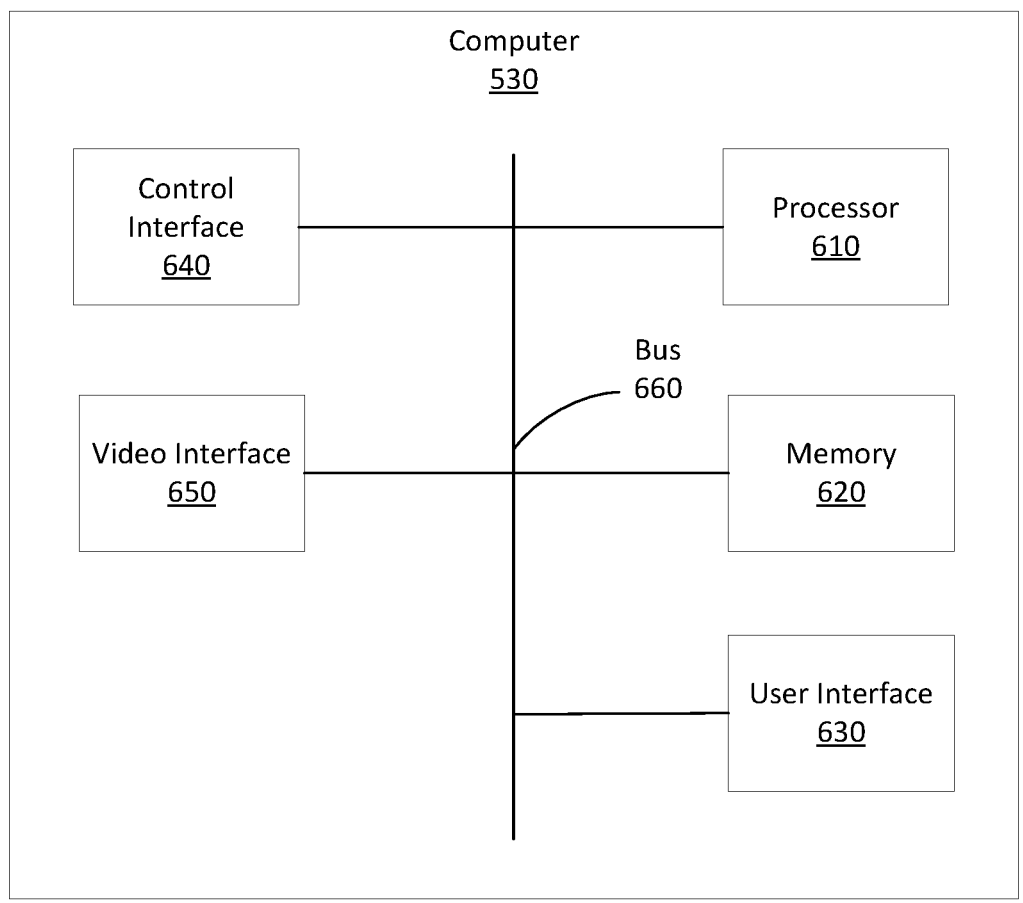
FIG. 6 is a block diagram of a computer communicatively coupled to a mount for performing the operation of engaging nanoporous metal structures with locking structures, according to an embodiment.

FIG. 6 is a block diagram of the computer 530 for performing the operation of engaging the nanoporous metal structures 120 with the locking structures 160, according to an embodiment. The computer 530 may include, among other components, a processor 610, a memory 620, a user interface 630, a control interface 640, a video interface 650 and a bus 460 connecting these components. Some embodiments of the computer 530 have different and/or other components than those shown in FIG. 6.

The computer 530 may be a personal computer (PC), a video game console, a tablet PC, a smartphone, or any machine capable of executing instructions (sequential or otherwise) that specify actions to be taken by that device. The computer 530 can operate as a standalone device or a connected (e.g., networked) device that connects to other machines. Furthermore, while only a single device is illustrated, the term "device" shall also be taken to include any collection of devices that individually or jointly execute instructions to perform any one or more of the methodologies discussed herein.

The processor 610 is a processing circuitry configured to carry out instructions stored in the memory 620. For example, the processor 610 can be a central processing unit (CPU) and/or a graphics processing unit (GPU). The processor 610 may be a general-purpose or embedded processor using any of a variety of instruction set architectures (ISAs). Although a single processor 610 is illustrated in FIG. 6, the computer 530 may include multiple processors 410.

The memory 620 is a non-transitory machine-readable medium which stores data and instructions (e.g., software) embodying any one or more of the methodologies or functions described herein. For example, the memory 620 may store instructions which when executed by the processor 610 configure the processor 610 to perform the method, described below in detail with reference to FIG. 6. Instructions may also reside, completely or at least partially, within the processor 610 (e.g., within the processor's cache memory) during execution thereof by the computer 530.

The user interface 630 is hardware, software, firmware, or a combination thereof that enables a user to interact with the computer 530. The user interface 630 can include an alphanumeric input device (e.g., a keyboard) and a cursor control device (e.g., a mouse, a trackball, a joystick, a motion sensor, or other pointing instrument). For example, a user uses a keyboard and mouse to select position parameters for position a first substrate 110 on the second substrate 150.

The control interface 640 transmits control signals to the actuator 520. For example, the control interface 640 is a circuit or a combination of circuits and software that interfaces with the actuator 520 to transmit the control signals.

The video interface 650 is a circuit or a combination of circuit and software that receives image data via the measurement signals from the sensor 540 and transfers the image data to the memory 620 and/or processor 610 to be stored and processed.

The computer 530 executes computer program modules for providing functionality described herein. As used herein, the term "module" refers to computer program instructions and/or other logic used to provide the specified functionality. Thus, a module can be implemented in hardware, firmware, and/or software. In some embodiments, program modules formed of executable computer program instructions are loaded into the memory 620, and executed by the processor 610. For example, program instructions for the method of FIG. 8 described herein can be loaded into the memory 620, and executed by the processor 610.

Figure 7:
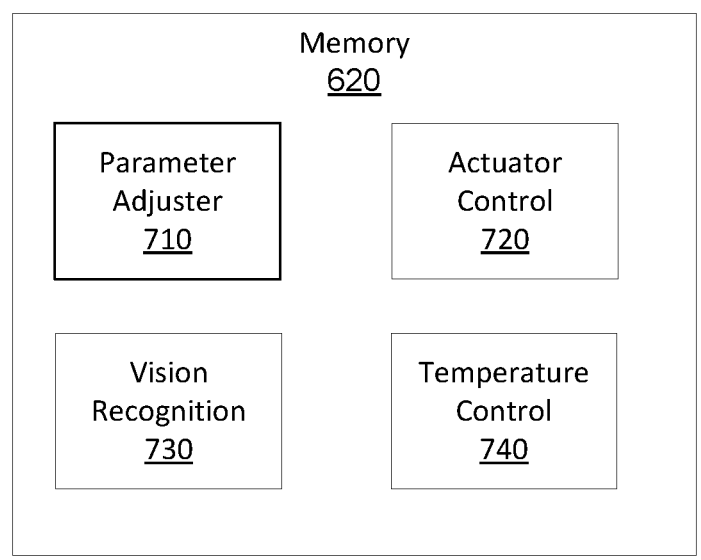
FIG. 7 is a block diagram of software modules in the memory of the computer, according to an embodiment.

FIG. 7 is a block diagram of software modules in the memory of the computer, according to one embodiment. The memory 620 may store, among other modules, an actuator control module 720, a temperature control module 740, a vision recognition module 730, and a parameter adjuster module 710. The memory 620 may include other modules not illustrated in FIG. 5.

The parameter adjuster module 710 provides instructions for monitoring the position parameters and adjusting them in real time as needed. The parameter adjuster module 710 can adjust the position parameters in response to one or more substrates 110 failing under a position criteria. The parameter adjuster module 710 may determine which parameters to adjust based on the failed criteria. For example, if first substrate 110 is incorrectly placed on the second substrate 150 (e.g., between locking structures 160), the position location can be adjusted. In another example, if the first substrate 110 moves after being positioned (this may indicate that the nanoporous metal structures 120 did not properly bond to the locking structures 160), the position time and pressure may be adjusted. The adjusted parameters can be temporarily adjusted for the first substrate 110 currently being placed or permanently adjusted for the current and future position of first substrate 110. The parameter adjuster module 710 can continually adjust the position parameters until one or more emitting states satisfy the criteria. This can allow for optimizing the position parameters of the position process and allow insight into root causes of failed first substrate 110 position.

The actuator control module 720 provides instructions for generating control signals to control the actuator 520 to adjust one or more position parameters. The position parameters relate to the positions of one or more substrates 110 on the second substrate 150. The position parameters include a position location, a position angle, a position pressure, a position temperature, and a position time. The position location is the location of the first substrate 110 relative to the second substrate 150. The position angle is the angle of the first substrate 110 relative to the second substrate 150 and, more specifically, the angle of the nanoporous metal structures 120 relative to the locking structures 160. The position pressure is the pressure applied to the first substrate 110 by the mount 510 once it is placed on the second substrate 150. The position time is the amount of time that the position pressure and the position temperature are applied to the first substrate 110. The position temperature is the temperature of the second substrate 150 or a temperature change of the second substrate 150 during the position of the first substrate 110.

The vision recognition module 730 performs analysis on the measurement data to measurement signals to determine the position of the first substrate 110. Specifically, the vision recognition module 730 determines whether the position of the first substrate 110 fails one or more criteria. The criteria form a standard for determining proper position of one or more first substrates 110. The position of the first substrate 110 may fail under the criteria for any number of reasons, such as, for example, a first substrate 110 is placed at an incorrect position location, position angle, position time, position pressure, position temperature, etc.

The temperature control module 740 sets the position temperature by controlling the temperature, for example using a heat plate. In some embodiments, the position parameters also include heating ramp shape, underfill or flux behavior, the influence of lateral movements (e.g. caused by thermal expansion) on position formation, the influence of metal oxides, allowable pressure range, and allowable temperature range.

Process for Engaging Nanoporous Metal Structures with Locking Structures

Figure 8:
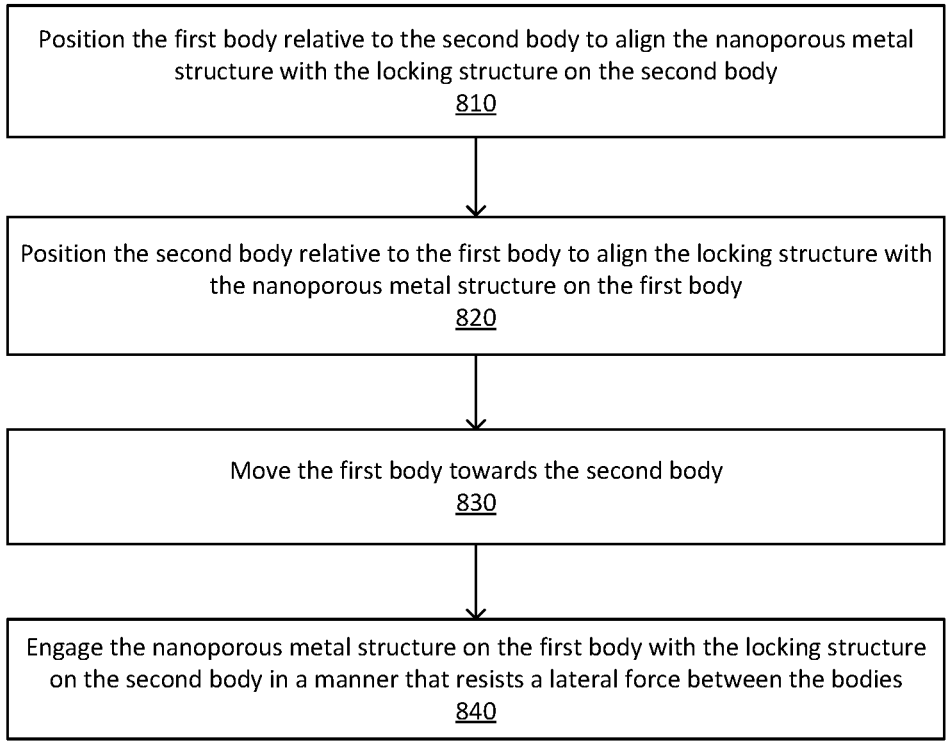
FIG. 8 is a flow chart describing the process for engaging nanoporous metal structures with locking structures, according to an embodiment.

FIG. 8 is a flow chart describing the process for engaging nanoporous metal structures 120 with a locking structures 160, according to an embodiment. The process may include different or additional steps than those described in conjunction with FIG. 8 in some embodiments or perform steps in different orders than the order described in conjunction with FIG. 8.

As illustrated in FIGS. 2A-2C, 3A-3C, 4A-4C, and 5, the first body of the interconnect (i.e., first substrate 110) on which the nanoporous metal structures 120 are grown is positioned 810 relative to the second body (i.e., second substrate 150) to align the one or more nanoporous metal structures with the locking structures 160 on the second body. Similarly, the second body is positioned 820 relative to the first body to align the locking structures 160 with the nanoporous metal structures on the first body. The position of the first body is moved 830 towards the second body such that the distance between the two bodies decreases. Accordingly, as the first body moves closer to the second body, the tips of the nanoporous metal structures 120 come in contact with the opposing locking structures 160. In one embodiment, the body to which the array of nanoporous metal structures are mounted is held at a fixed position relative to the movement of the other body. In an alternate embodiment, the body including locking structures 160 is also adjusted by a second actuator while the position of the other body is simultaneously adjusted by the first actuator. The position of the body on which the nanoporous metal structures 120 are grown is moved until the nanoporous metal structures 120 engage 840 with the locking structures 160 on the second body in a manner that resists lateral forces acting on the surfaces of either bodies.

In some embodiments, the nanoporous metal structures 120 and the locking structures 160 are mounted to the opposite bodies of the interconnect compared to the above description, for example the nanoporous metal structures 120 are grown on the second substrate 150 and the locking structures 160 grown on the first substrate 110. In additional embodiments, the actuator may adjust the position of the body on which the locking structures 160 are formed while holding the body on which the nanoporous metal structures 120 are grown at a fixed position. Regardless of the orientation of the nanoporous metal structures 120 and the locking structures 160 or the surface adjusted by the actuator, the device created by coupling a nanoporous metal structure 160 and a locking structure is consistent with the above description. Additionally, the second substrate 150 may be replaced with an alternate electronic element, for example an LED.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A method comprising:
positioning a first body relative to a second body to align a nanoporous metal structure of a stepped conical shape with multiple levels of flat surfaces facing a top surface of the second body and protruding from a first conductive surface of the first body with a locking structure on the top surface of the second body facing the first conductive surface; and
after positioning the first body relative to the second body, applying a mechanical pressure to the nanoporous metal structure or the locking structure to engage the nanoporous metal structure with the locking structure in a manner that resists a lateral force between the first body and the second body during assembly or after assembly of the first body and the second body.

2. The method of claim 1, wherein applying the mechanical pressure to the nanoporous metal structure or the locking structure to engage the nanoporous metal structure with the locking structure comprises:
applying the mechanical pressure to cause at least a tip of the nanoporous metal structure to collapse into the locking structure.

3. The method of claim 1, wherein the tip of the nanoporous metal structure that collapses into the locking structure fills an indented portion of the locking structure.

4. The method of claim 1, further comprising forming the nanoporous metal structure by an electroplating process and a dealloying process before positioning the first body relative to the second body.

5. The method of claim 4, wherein forming the nanoporous metal structure comprises immersing the first body in a series of solutions with different metal compositions during the electroplating process.

6. The method of claim 1, wherein the nanoporous metal structure comprises a nanoporous gold structure.

7. The method of claim 1, wherein the nanoporous metal structure engages with the locking structure by having a pin, the pin protruding from the top surface of the second body and penetrating into the nanoporous metal structure.

8. The method of claim 1, wherein the first body is a light emitting diode and the second body is a substrate formed with circuits to operate the light emitting diode.

9. A non-transitory computer readable medium storing executable computer program instructions, the computer program instructions comprising instructions that when executed cause a computer processor to:
position a first body relative to a second body to align a nanoporous metal structure of a stepped conical shape with multiple levels of flat surfaces facing a top surface of the second body and protruding from a first conductive surface of the first body with a locking structure on the top surface of the second body facing the first conductive surface; and
after positioning the first body relative to the second body, apply a mechanical pressure to the nanoporous metal structure or the locking structure to engage the nanoporous metal structure with the locking structure in a manner that resists a lateral force between the first body and the second body during assembly or after assembly of the first body and the second body.

10. The non-transitory computer readable medium of claim 9, wherein the computer program instructions for applying the mechanical pressure to the nanoporous metal structure or the locking structure to engage the nanoporous metal structure with the locking structure comprise instructions that when executed cause the computer processor to:
apply the mechanical pressure to cause at least a tip of the nanoporous metal structure to collapse into the locking structure.

11. The non-transitory computer readable medium of claim 9, wherein the tip of the nanoporous metal structure that collapses into the locking structure fills an indented portion of the locking structure.

12. The non-transitory computer readable medium of claim 9, wherein the computer program instructions comprising instructions that when executed cause a computer processor to:
form the nanoporous metal structure by an electroplating process and a dealloying.

13. The non-transitory computer readable medium of claim 12, wherein the computer program instructions for forming the nanoporous metal structure comprise instructions that when executed cause the computer processor to:
immerse the first body in a series of solutions with different metal compositions during the electroplating process.

14. The non-transitory computer readable medium of claim 9, wherein the nanoporous metal structure comprises a nanoporous gold structure.

15. The non-transitory computer readable medium of claim 9, wherein the nanoporous metal structure engages with the locking structure by having a pin, the pin protruding from the top surface of the second body and penetrating into the nanoporous metal structure.

16. The non-transitory computer readable medium of claim 9, wherein the first body is a light emitting diode and the second body is a substrate formed with circuits to operate the light emitting diode.

17. A computer system, comprising:
a computer processor for executing computer program instructions; and
a non-transitory computer-readable memory storing computer program instructions executable by the computer processor to perform operations comprising:
positioning a first body relative to a second body to align a nanoporous metal structure of a stepped conical shape with multiple levels of flat surfaces facing a top surface of the second body and protruding from a first conductive surface of the first body with a locking structure on the top surface of the second body facing the first conductive surface; and
after positioning the first body relative to the second body, applying a mechanical pressure to the nanoporous metal structure or the locking structure to engage the nanoporous metal structure with the locking structure in a manner that resists a lateral force between the first body and the second body during assembly or after assembly of the first body and the second body.

18. The computer system of claim 17, wherein applying the mechanical pressure to the nanoporous metal structure or the locking structure to engage the nanoporous metal structure with the locking structure comprises:
applying the mechanical pressure to cause at least a tip of the nanoporous metal structure to collapse into the locking structure.

19. The computer system of claim 17, wherein the tip of the nanoporous metal structure that collapses into the locking structure fills an indented portion of the locking structure.

20. The computer system of claim 17, further comprising forming the nanoporous metal structure by an electroplating process and a dealloying process before positioning the first body relative to the second body.

* * * * *